United States Patent [19]

Nakayama

[11] Patent Number: 4,518,668
[45] Date of Patent: May 21, 1985

[54] METHOD FOR PREPARING A LITHOGRAPHIC PRINTING PLATE

[75] Inventor: Takao Nakayama, Shizuoka, Japan

[73] Assignee: Fuji Photo Film Co., Ltd., Kanagawa, Japan

[21] Appl. No.: 478,570

[22] Filed: Mar. 24, 1983

[30] Foreign Application Priority Data

Mar. 24, 1982 [JP] Japan .................. 57-45558

[51] Int. Cl.³ ............... G03G 1/94; G03G 13/28; G03G 13/00; C25D 11/34
[52] U.S. Cl. ........................ 430/49; 430/54; 430/100; 430/103; 430/302
[58] Field of Search .............. 430/49, 54, 302, 103, 430/100

[56] References Cited

U.S. PATENT DOCUMENTS

| | | | |
|---|---|---|---|
| 3,313,626 | 4/1967 | Whitney | 430/302 |
| 3,704,121 | 11/1972 | Makino et al. | 430/54 X |
| 3,782,813 | 1/1974 | Smith | 430/103 |
| 3,945,822 | 3/1976 | Verhille | 430/54 |
| 4,301,229 | 11/1981 | Sakaki et al. | 430/302 X |
| 4,322,488 | 3/1982 | Kuehnle et al. | 430/103 |
| 4,350,749 | 9/1982 | Ohnuma et al. | 430/100 |

FOREIGN PATENT DOCUMENTS

| | | | |
|---|---|---|---|
| 53362 | 9/1982 | European Pat. Off. | |
| 1165038 | 9/1969 | United Kingdom | 430/100 |

OTHER PUBLICATIONS

Rayford S. Bixby, "Reversal Development of Continuous—Tone Xerographic Images", Photographic Eng., vol. 6, No. 3, 1955.

Primary Examiner—John E. Kittle
Assistant Examiner—Mukund J. Shah
Attorney, Agent, or Firm—Sughrue, Mion, Zinn, Macpeak and Seas

[57] ABSTRACT

A method for preparing a lithographic printing plate is disclosed. The method involves providing a light-sensitive material comprised of an electroconductive support having a hydrophilic surface. The surface has provided thereon a light-sensitive layer and a photo-conductive insulating layer which may be provided in that order or combined in a single layer. The material is imagewise exposed and then subjected to electrophotographic processing to form an electrostatic latent image on the photoconductive insulating layer. After exposure the electrostatic latent image is developed with developer particles which are opaque to the light to which the light-sensitive layer is sensitive in the presence of an electrode facing the photoconductive insulating layer. The development is carried out while applying a bias voltage between the electrode and the light-sensitive layer so that residual charge on the non-latent image areas appears zero. The exposed or unexposed areas of the light sensitive layer are then removed together with the photoconductive insulating layer. The method provides a lithographic printing plate which has high resolution without a printing stain.

17 Claims, 4 Drawing Figures

METHOD FOR PREPARING A LITHOGRAPHIC PRINTING PLATE

FIELD OF THE INVENTION

This invention relates to an improved method for preparing a lithographic printing plate and, more particularly, to a method for preparing a lithographic printing plate by an electrophotographic method.

BACKGROUND OF THE INVENTION

A light-sensitive material having a photoconductive layer which is used for making a printing plate by an electrophotographic method is known. For example, a light-sensitive material used for a printing plate comprising a support having provided thereon a metal layer, a photoresist layer and a photoconductive layer as an uppermost layer has been proposed.

Complicated steps which comprise uniformly charging a photoconductive layer, imagewise exposing it to a light to which a photoresist layer is insensitive to prepare an electrostatic latent image on the photoconductive layer, developing the latent image with a toner, fixing or non-fixing a toner image, exposing the photoresist layer under a different condition from that as mentioned above to harden the exposed portion of the photoresist layer, removing the toner image and the photoconductive layer, removing the unhardened portion of the photoresist layer with a solvent, etching a metal layer and removing the photoresist layer remaining on a metal layer are required to prepare a printing plate using the above mentioned light-sensitive material. A high degree of skill is required to prepare a good printing plate. However, the resolving power of the plate is not satisfactory since the developing method of an electrostatic latent image formed on the photoconductive layer is formed by a dry method. Furthermore, clearness of a printing image thus-obtained is not satisfactory because of the removal of a photoresist layer and an etching operation of a metal layer.

To eliminate the above defects, European Patent Application, Published No. 0053362 discloses a method for preparing a lithographic printing plate using the light-sensitive material comprising a conductive support having a hydrophilic surface having provided thereon a positive working light-sensitive layer and a photoconductive insulating layer. The method comprises (1) a step of forming a latent image electrophotographically on the photoconductive layer of the light-sensitive material, (2) a step of developing the latent image with a liquid developer containing developer particles which are opaque to the light to which the positive working light-sensitive layer is light-sensitive, (3) a step of exposing the positive working light-sensitive layer through the developed image thus-obtained in step (2), and (4) a step of selectively removing the areas of the positive working light-sensitive layer which do not have the developed image.

The above method offers improvement on the conventional method with respect to simplification of the steps and resolving power. However, a printing stain is caused when printing is carried out using the printing plate obtained by the above method.

SUMMARY OF THE INVENTION

The present inventor has investigated and found that in step (2) of the development with toners, the residual charge on non-latent image areas can be removed by development while applying a bias voltage between the electrode facing the photoconductive insulating layer and the light-sensitive material in a direction to partially remove the charge on the latent images of the photoconductive insulating layer and, therefore, no fog occurs during development. Accordingly, it is possible to obtain a lithographic printing plate without producing printing stain.

When using either a positive working light-sensitive layer or a negative working light-sensitive layer, a lithographic printing plate can be obtained which does not cause printing stain. The plate is obtained by applying a bias voltage between the electrode and the light-sensitive material during toner development.

Accordingly, an object of this invention is to provide a method for preparing a lithographic printing plate having excellent resolving power which does not cause printing stain.

The present invention is a method for preparing a lithographic printing plate which comprises electrophotographically treating light-sensitive material comprising a conductive support having a hydrophilic surface and having provided thereon a light-sensitive layer and a photoconductive insulating layer which form one layer or two layers respectively to form electrostatic latent images on the photoconductive layer; developing the electrostatic latent image with developer particles which do not pass the light which the light-sensitive layer is light-sensitive to in the presence of a counter electrode; exposing the light-sensitive layer through the thus-obtained developed images; and removing the exposed or unexposed areas of the light-sensitive layer. The present invention is characterized in that the development is carried out by applying the bias voltage between the counter electrode and the light-sensitive material so that the residual charge on the non-latent imaged areas appears zero.

DETAILED DESCRIPTION OF THE INVENTION

Figure 1:
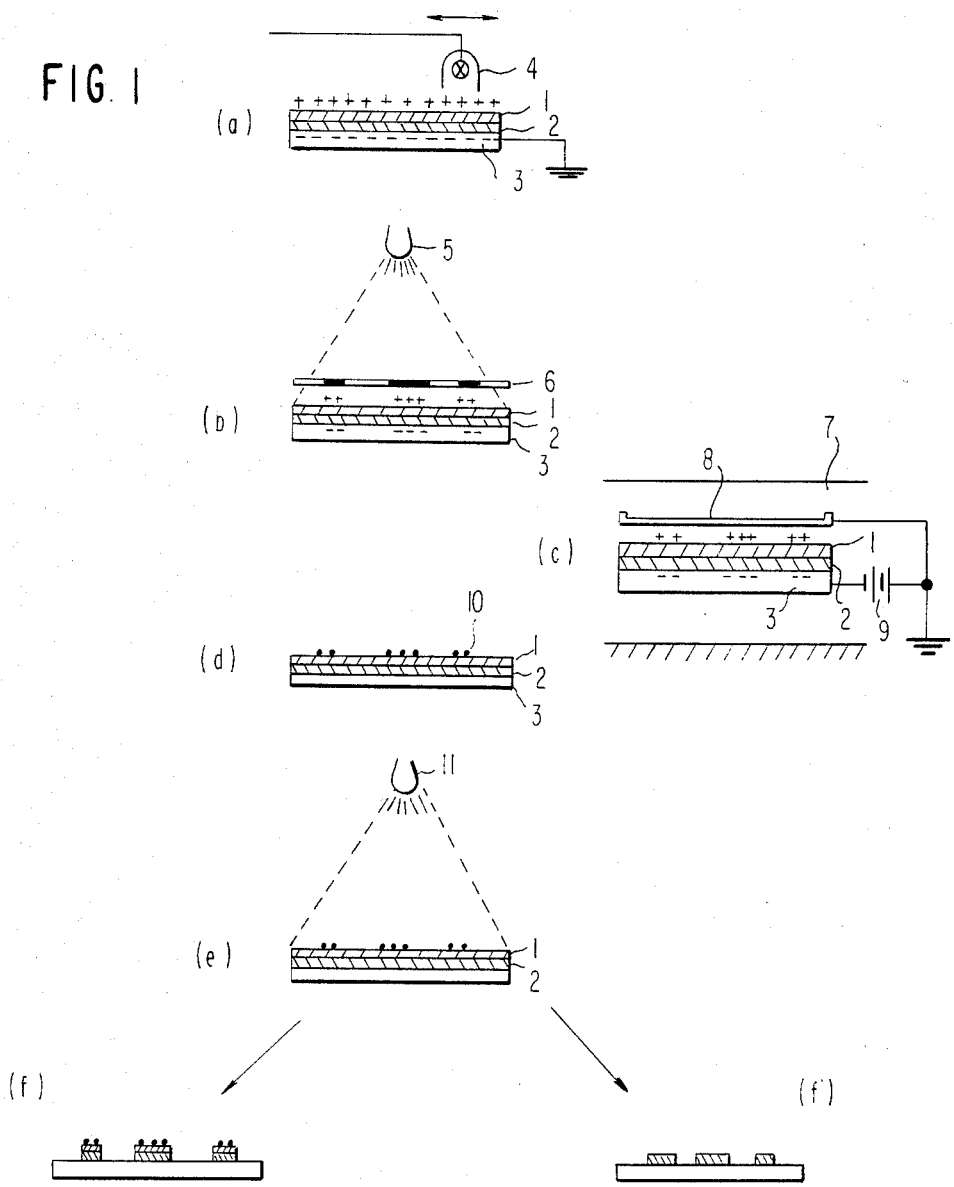
FIG. 1 is a schematic diagram showing steps a, b, c, d, e, f and f' of the method of preparing a lithographic printing plate of the present invention.

This invention is explained in detail below by the accompanying drawings with respect to an embodiment using a positive working light-sensitive layer. FIG. 1 is a schematic view showing one embodiment of this invention showing the steps of preparing a lithographic printing plate. In FIG. 1(a), the surface of the photoconductive insulating layer (1) provided on the positive working light-sensitive layer (2) which contains a conductive agent as described hereinafter and is formed on a conductive support is charged with a charging device (4), while the conductive support being earthed. The charging device is a corotron type device which is commonly used in electrophotography.

The photoconductive insulating layer (1) is imagewise exposed (b) by a lamp (5) to remove the charge on the non-imaged areas. If a positive original is used as an original (6), a positive latent image having a positive charge can be obtained. Toner development is then carried out. As mentioned above, the charge at non-image areas is not completely removed during an imagewise exposure by the presence of the oxidized layer and the light-sensitive layer (2) on the support, which is the cause of a fog at development and also the cause of the printing stain. Therefore, in accordance with this invention during development (c), for example, when the electrostatic latent image is developed in a liquid developer (7), a bias voltage is applied between the electrode (8) and the support (3) in a direction which makes it possible to partially remove the charge on the latent image so that the residual charge on the non-latent image areas appears to be zero. (When the electrostatic latent image is positively charged, a positive bias voltage is applied on the electrode). The value of the bias voltage is generally 20 to 250 volts, because, through the residual charge on the non-latent image areas appears zero, the charge on the electrostatic latent image substantially needs to partially remain in a degree that development with a toner can proceed successfully. For example, if a latent image has a charge of +300 volts, and the residual potential on the non-latent image areas is +30 volts, a bias voltage about +30 volts can be applied to the electrode. In this case, the charge at the latent image is +270 volts which is sufficient to conduct the development with a toner. Thus, in step (d), a toner image (10) is prepared. The developing time varies depending upon the charging potential of the light-sensitive material, ζ potential of the toner, the electrode (development electrode), and the method of development. The development time is generally several seconds to 1 minute to obtain sufficient density to use as a photopattern mask in the next step.

The shorter the distance between the electrode and the light-sensitive material is, the better the result. Generally, the distance therebetween is 0.5 to 10 mm and the developing time is several seconds to 1 minute. The developing solution is removed from the light-sensitive plate by a squeeze after development, and the light-sensitive plate is exposed over its entire surface in step (e) by an ultraviolet lamp (11) to render the non-image areas of the positive working light-sensitive layer soluble. The light-sensitive plate is then dissolved with an alkali solution in steps (f) and (f') to remove the non-image areas of the light-sensitive layer and finally a lithographic printing plate having a positive image on the support is obtained. In the dissolution step, the remaining areas are a positive image on a support comprising an insoluble positive working light-sensitive layer, a photoconductive insulating layer and a toner layer [(f) in FIG. 1]. A positive image can clearly be read with a toner.

A particularly preferable feature of this invention is that multicolored lithographic printing plates can be obtained. Such plates are obtained when colored images are developed with a toner, the color of which corresponds to that of each of the colored images obtained by a color separation such as cyan, magenta, yellow and black.

Figure 2:
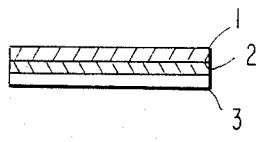
FIG. 2 is a cross sectional view of an embodiment of the light-sensitive material of the invention.
Figure 3:
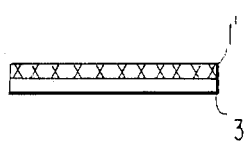
FIG. 3 is a cross sectional view of a second embodiment of the light-sensitive material of the invention.

The light-sensitive material used in this invention comprises a conductive support (3) having provided thereon a photoconductive insulating layer (1) and a positive working light-sensitive layer (2) respectively as shown in FIG. 2. In addition, the material comprises a conductive support (3) having provided thereon a mixed layer (1') of the light-sensitive layer and the photoconductive insulating layer as shown in FIG. 3.

Figure 4:
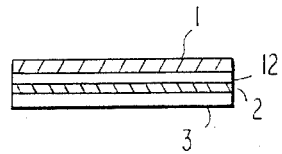
FIG. 4 is a cross sectional view of a third embodiment of the light-sensitive material of the invention.

Another embodiment of this invention is a light-sensitive material having an intermediate layer (12) between a photoconductive insulating layer (1) and a positive working light-sensitive layer as shown in FIG. 4. This intermediate layer must be electroconductive, because it accelerates the electric charge having an opposite pole to that charged on a surface of a photoconductive insulating layer being retained on the side of the positive working light-sensitive layer on the conductive support. This intermediate layer can prevent a photoconductive insulating layer from penetrating into or mixing with the positive working light-sensitive layer. The intermediate layer can be a water-soluble resin which is properly electroconductive and insoluble to the positive working light-sensitive layer, and is dissolved and removed in a dissolution step (f') together with a photoconductive insulating layer having a toner image. Thus, a lithographic printing plate having an image area comprised of the positive working light-sensitive layer on a support can be obtained.

When the photoconductive insulating layer and a positive working light-sensitive layer form one layer in this invention, it is provided by a homogeneous dispersion obtained by mixing a powder of a photoconductive material, an insulating binding resin and a positive working light-sensitive solution which is prepared and coated on a surface of the conductive support which was subjected to graining treatment and drying.

A thickness of the photoconductive insulating layer generally effects on the charging property, light penetration, time of development and resolving power degree and is generally 0.5 to 5µ and preferably 1 to 2µ.

A thickness of the intermediate layer is determined by the permeability of the solvent used in the dissolution step and the resolving power and is generally 0.1 to 5µ and preferably 0.2 to 0.5µ.

The photoconductive material used as a photoconductive insulating layer in this invention includes those that are generally used as a light-sensitive material for electrophotography. It is preferred that the photoconductive material is used as a dispersion dispersed in or a solution dissolved in an insulating binding resin and is of the type that does not absorb the light which the positive working light-sensitive layer residing under the photoconductive insulating layer absorbs. Further, the photoconductive insulating layer should be as thin as possible so that the light penetration amount is large in the light-sensitive material for the lithographic printing in this invention. The photoconductive insulating layer can be positively or negatively charged. The photoconductive material suitable for positive corona charging includes an inorganic material such as Se, Se—Te and PbO; a low molecular weight substance such as anthracene, perylene, tetracene, carbazole, tetrabenzyl-p-phenylenediamine, an acylhydrazone derivative, an oxadiazole derivative, a pyrazoline derivative, an imidazolone derivative, an imidazothion derivative, a benzimidazole derivative, a benzoxazole derivative, and a benzothiazole derivative; an organic pigment such as indigo, metal free phthalocyanine, metal phthalocyanine, squarium, dimethyl peryllimido; and an organic high molecular weight substance such as poly-N-vinylcarbazole, polyacenaphthylene, polyvinyl anthracene, polyvinyl pyrene, polyvinyltetracene or polyvinyl perillene. The photoconductive material suitable for negative corona charging includes an inorganic material such as ZnO, CdS or $TiO_2$; a low molecular weight substance such as trinitrofluorenone, tetranitrofluorenone, dinitroanthracene and tetracyanopyrene; an organic pigment such as chlorodiane blue; and a complex of poly-N-vinylcarbazole and 2,4,7-trinitrofluorenone. The photoconductive material suitable for negative and positive corona charging can be a combination of the above-mentioned organic substances and a binding resin and particularly those that have a practically high sensitivity which include metal free phthalocyanine, metal phthalocyanine, an oxadiazole derivative or a pyrazoline derivative. A light-sensitive material containing a charge generator and a charge transfer and a copolymer of an alkali-soluble resin and a photoconductive substance such as carbazole can also be used.

It is preferred that the photoconductive insulating layer contains an alkali-soluble resin, because the photoconductive insulating layer does not prevent the selective removal of the positive working light-sensitive layer in step of (f) and (f'). More specifically, the non-imaged areas of the photoconductive insulating layer are dissolved and removed together with the non-imaged areas of the positive working light-sensitive layer. The alkali-soluble resin is preferably an insulating resin capable of forming a film and useful as a binding agent for the high molecular organic photoconductive substance or as a solvent for the low molecular weight organic photoconductive substance. The resin includes a synthetic resin such as phenol-formaldehyde resin, methacresol formaldehyde resin, styrene-maleic anhydride copolymer, polyacrylic acid-polyacrylamide copolymer, fumaric acid-ethylene glycol copolymer, methyl vinyl ether-maleic anhydride copolymer, acryloyl glycine-vinyl acetate copolymer, polyvinyl pyrrolidone, polyvinyl alcohol, polyamide, alkali-soluble azide resin and halogenated polystyrene and a natural resin such as shellac, protein and glue.

A binding agent for particles of the photoconductive material used for the photoconductive insulating layer is an insulating resin which improves the charging property of the insulating layer such as polyethylene terephthalate, polyimide, polycarbonate, polyacrylate, polymethyl methacrylate, polyvinyl fluoride, polyvinyl chloride, polyvinyl acetate, polystyrene, styrene-butadiene copolymer, polymethacrylate, silicone resin, chlorinated rubber, epoxy resin, pure and modified alkyd resin, polyethyl methacrylate, poly-n-butyl methacrylate, a cellulose acetate, ketone resin, polyethylene, polypropylene, polyacrylonitrile, a rosin derivative, polyvinylidene chloride and nitrocellulose.

The intermediate layer provided, if necessary, between the photoconductive insulating layer and the positive working light-sensitive layer can contain a water-soluble resin having a suitable conductivity such as polyvinyl alcohol, alkyl hydroxyalkyl cellulose, polyacrylic acid, polyacrylic acid derivative, polyacrylamide, polyvinyl pyrrolidone, polyvinyl methyl ether or reaction products of maleic anhydride with vinyl compound or acrylic compound.

A positive working light-sensitive layer can be prepared by dissolving a light-soluble substance, e.g., an o-quinonediazide compound or a depolymerizable light-sensitive resin alone or in combination with an alkali-soluble resin in a proper solvent and coating it on an electroconductive support. An alkali-soluble resin includes those as mentioned above used for the photoconductive insulating layer and it is included in an amount of about 50 to 85 wt% of the light-sensitive layer. Conventionally known plasticizers such as dioctyl phthalate can be incorporated in an amount of not more than 5 wt% in the light-sensitive layer to give flexibility. This positive working light-sensitive layer is coated in an amount of about 0.5 to 7 $g/m^2$ on a conductive support.

The mixing ratio of the photoconductive material, the insulating resin and the alkali-soluble resin in the photoconductive insulating layer is determined by the photoconductivity, the charging property, the light penetration, and the dissolving and permeating speed of the developing solution. Good characteristics are obtained when the mixing ratio is 5 to 30 wt% of the photoconductive material, 0 to 30 wt% of the insulating resin and 50 to 85 wt% of the alkali-soluble resin. Where an alkali-soluble resin having low electric resistance is used, the charging property is improved by the insulating resin, and where an alkali-soluble resin having high electric resistance is used, the insulating resin may not be present. Where a photoconductive insulating layer and a positive working light-sensitive layer are combined to form a single layer, the mixing ratio is 5 to 30 wt% of the photoconductive material, 0 to 30 wt% of the insulating resin and 50 to 85 wt% of a light-solubilizable substance.

When the positive working light-sensitive layer and the photoconductive layer are provided respectively in this invention, by lowering the electric resistance of the light-sensitive layer (not higher than $10^9 \Omega/cm^2$ by incorporating the conductive agent into the light-sensitive layer), the residual charge at the non-latent imaged areas of the photoconductive insulating layer where the image exposure is made is decreased and the bias voltage applied on the counter electrode at development can be lowered. The conductive agents used in this invention do not affect the light-sensitive characteristics of the light-sensitive layer or printing characteristics and can give suitable conductivity to the light-sensitive layer.

Useful conductive agents include colloidal alumina; colloidal silica; metallic powder such as Al, Zn, Ag, Fe, Cu, Mn or Co; metallic salts thereof such as chloride, bromide, sulfate, nitrate or oxalate; metal oxides such as ZnO, $SnO_2$ or $In_2O_3$; surface active agents such as alkanol amine salt of alkyl phosphate, polyoxyethylene alkyl phosphate, polyoxyethylene alkyl ether, alkylmethyl ammonium salt, N,N-bis(2-hydroxyethyl)-alkylamine, alkyl sulfonate, alkylbenzenesulfonate, fatty acid choline ester, polyoxyethylene alkylether, the phosphate thereof and the salt thereof, fatty monoglyceride, partially esterified fatty acid sorbitan, a cationic high molecular weight electrolyte; and an anionic high molecular weight electrolyte.

Useful cationic high molecular weight electrolytes include primary, secondary and tertiary ammonium salt such as polyethylene imine hydrochloride or poly(N-methyl-4-vinylpyridinium chloride); a quaternary ammonium salt such as poly(2-methacryloxyethyltrimethyl ammonium chloride), poly(2-hydroxy-3-methacryloxypropyltrimethyl ammonium chloride), poly(N-acrylamidopropyl-3-trimethyl ammonium chloride), poly-(N-methylvinylpyridinium chloride), poly(N-vinyl-2,3-dimethylimidazolium chloride), poly(diallyl ammonium chloride) or poly(N,N-dimethyl-3,5-methylenepiperidinium chloride); a sulfonium salt such as poly(2-acryloxyethyldimethylsulfonium chloride); and a phosphonium salt such as poly(glycidyltributylphosphonium chloride). Useful anionic high molecular weight electrolytes include a carboxylate such as poly(-meth)acrylic acid, hydrolyzed polyacrylate, hydrolyzed polyacrylic amide or hydrolyzed polyacrylic nitrile; polystyrene sulfonate, polyvinyl sulfonate; and phosphonate such as polyvinyl phosphonate.

The above-mentioned conductive agents can be used alone or in combination, and can be added to a coating composition prior to coating the light-sensitive layer. The amount of the electroconductive agent is determined so that the resistance of the light-sensitive layer is not higher than $10^9 \Omega/cm^2$, and so that the characteristics of the light-sensitive layer are not degraded.

The electroconductive support which is lowermost on the light-sensitive material for lithographic printing used in this invention is, for example, a surface treated aluminum plate, on which a positive working light-sensitive layer is provided. Preferred examples of aluminum plates include a pure aluminum plate, an aluminum alloy plate and a plastic film laminated or vacuum-evaporated with an aluminum. It is preferred that a surface of the aluminum plate is subjected to graining treatment or anodic oxidation, or is dipped and soaked in an aqueous solution of sodium silicate, potassium fluoric zirconium or phosphate. The surface treatment is carried out not only to make the surface of the support hydrophilic but also to prevent the undesirable reaction of the support with the positive working light-sensitive layer provided thereon as well as to increase the close contact of the light-sensitive layer with the support.

When using an aluminum or an aluminum alloy support in this invention, it is preferred that the amount of the oxidized layer on the support is about 0.2 to 2.8 $g/m^2$. When using that amount, the residual charge remaining at the non-latent imaged area of the photoconductive layer can be decreased and the same effect obtained by incorporating the conductive agent into the light-sensitive layer can be obtained.

The liquid developer used in step (c) of the liquid development of this invention is a well-known carbon black dispersed in gasoline, kerosene and carbon tetrachloride which contains alkyd resin and a linseed oil to retain the electric characteristic uniformly, as disclosed in Japanese Patent Publication No. 13424/60. Both of negatively and positively charged toners can be used. Useful negatively charged toners include carbon black, lead chromate and charcoal dispersed in an aliphatic hydrocarbon, gasoline, cyclohexane, pentane and $CCl_4$ and containing a linseed oil, polyethylene and shellac as a controlling agent. Useful positively charged toners include carbon black, phthalocyanine blue, charcoal and vermilion red dispersion in an aliphatic hydrocarbon, kerosene, cyclohexane, pentane and $CCl_4$ containing alkyd resin, versamide and tergitol as a controlling agent. The size of the developer particle is not larger than $1\mu$, which is suitable for obtaining an image with a high degree of resolution.

The alkali solution used for dissolving and removing the exposed areas of the positive working light-sensitive layer in step (f) and (f') of this invention includes an aqueous solution of an inorganic alkali substance such as sodium silicate, potassium silicate, sodium hydroxide, potassium hydroxide, lithium hydroxide, sodium phosphate, sodium secondary phosphate, ammonium phosphate, ammonium secondary phosphate, sodium metasilicate, sodium bicarbonate or an aqueous ammonia. The concentration thereof is about 0.1 to about 10 wt%, and preferably about 0.5 to about 5 wt%. The pH of the alkali solution is 12.5 to 13.3, which is suitable for developing the positive working light-sensitive material. A surface active agent and an organic solvent can be incorporated in the alkali solution, if necessary.

In the above-mentioned explanations, a liquid development is conducted to develop the latent image of the photoconductive insulating layer, and a cascade development and a magnetic brush development can also be used.

This invention has been explained regarding the positive working light-sensitive layer as above, but the invention is also applied to the negative workin light-sensitive layer.

In the embodiment of this invention as shown in FIG. 1, a photoconductive layer 1 and a negative working light-sensitive layer 2 composed mainly of a diazo compound or a diazo resin are provided on an aluminum support 3. The same steps as in the case of the positive working light-sensitive layer are repeated regarding the charging, image-exposure, a toner development and a complete surface exposure with an ultraviolet ray. In the case of the negative working light-sensitive layer, when the ultraviolet radiation is carried out, the non-imaged areas of the light-sensitive layer where a toner is not present are hardened or insoluble, and the non-exposed areas where a toner is present are removed and the exposed areas of the light-sensitive layer remain on a support. Thus, a lithographic printing plate having a hydrophobic positive image of the light-sensitive layer can be obtained.

The other materials and the processing conditions are entirely the same with the case with regard to the positive working light-sensitive layer. When using the negative working light-sensitive layer, a reversal development is not necessary to change from a negative image to a positive image.

The composition of the negative working light-sensitive light is a diazo compound or a diazo resin alone as disclosed in U.S. Pat. No. 2,714,066 and a mixture of a diazo compound or a diazo with a binder, as disclosed in U.S. Pat. No. 2,826,501 and British Pat. No. 1,074,392.

The diazo compound includes diazonium salt and a diazo resin as a condensation product of p-diazodiphenylamine and formaldehyde.

Preferred diazo compounds are a compound having not less than 2 diazo groups in one molecule such as a condensation product of a formaldehyde with a salt of p-diazodiphenylamine such as a phenol salt, fluorocaprilate, and a salt of sulfonic acid such as triisopropylnaphthalenesulfonic acid, 4,4'-biphenyldisulfonic acid, 5-nitroorthotoluenesulfonic acid, 5-sulfosalicyclic acid, 2,5-dimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprilnaphthalenesulfonic acid, 1-naphthol-5-sulfonic acid, 2-methoxy-4-hydroxy-5-benzoylbenzenesulfonic acid and paratoluenesulfonic acid. Particularly preferred diazo compounds are a condensation product of 2,5-dimethoxy-4-p-tolylmercaptobenzenediazonium and formaldehyde including the above salts, a condensation product of 2,5-dimethoxy-4-morpholinobenzenediazonium and formaldehyde or acetoaldehyde and the compound as disclosed in Japanese Patent Application (OPI) No. 33907/73 (the term "OPI" as used herein refers to a "published unexamined Japanese patent application").

Those compounds as disclosed in U.S. Pat. No. 2,649,373 are also preferred.

The most preferred diazo compound is a 2-methoxy-4-hydroxy-5-benzoylbenzenesulfonate of a condensation product of p-diazodiphenylamine and formaldehyde.

The binder used together with a diazo compound includes a 2-hydroxyethyl methacrylate copolymer as disclosed in British Pat. No. 1,460,978 and U.S. Pat. No. 4,123,276, a copolymer of a monomer having an aromatic hydroxyl group as disclosed in Japanese Patent Application (OPI) No. 98614/79, a β-hydroxyethyl (meth)acrylate polymer and a copolymer having more than 50% of β-hydroxyethyl (meth)acrylate, a polymer of the above (meth)acrylate, a copolymer of a part of which is substituted with a low molecular polyurethane resin having a hydrophilic ether group as disclosed in Japanese Patent Publication No. 9697/81.

Further, a photopolymerizable composition used as a negative working light-sensitive layer is hereinafter explained. The photopolymerizable composition includes a binder, an addition polymerizable unsaturated monomer and a photopolymerization initiator. The binder of the photopolymerizable composition includes a copolymer of methyl (meth)acrylate/(meth)acrylic acid, a half ester and half amide of a copolymer of styrene/maleic anhydride, a copolymer of benzyl (meth)acrylate/(meth)acrylic acid, a copolymer of benzyl (meth)acrylate/itaconic acid, a copolymer of styrene/itaconic acid, a copolymer of vinyl acetate/crotonic acid, acid cellulose phthalate, and a copolymer of (meth)acrylic acid/styrene/alkyl (meth)acrylate.

The unsaturated monomer may be a compound having at least one addition polymerizable unsaturated group. Preferable examples include ethylene glycol di(meth)acrylate, polyethylene glycol di(meth)acrylate, trimethylolethane tri(meth)acrylate, trimethylolpropane tri(meth)acrylate, neopentylglycol di(meth)acrylate, pentaerythritol, tri-, tetra- and hexa(meth)acrylate of pentaerythritol, epoxydi(meth)acrylate, oligoacrylate as disclosed in Japanese Patent Publication No. 7361/77, an oligomer of acrylurethane resin and acrylurethane as disclosed in Japanese Patent Publication No. 41708/73.

As the photopolymerization initiators, there are vicinal polyketaldonyl compound as disclosed in U.S. Pat. No. 2,367,660, α-carbonyl compound as disclosed in U.S. Pat. Nos. 2,367,661 and 2,367,670, acyloinether as disclosed in U.S. Pat. No. 2,448,828, an aromatic acyloin compound substituted with α-hydrocarbon as disclosed in U.S. Pat. No. 2,722,512, polynuclear quinone compound as disclosed in U.S. Pat. Nos. 3,046,127 and 2,951,758, a combination of triallylimidazole dimer/p-aminophenol ketone as disclosed in U.S. Pat. No. 3,549,367, benzothiazole compound as disclosed in Japanese Patent Publication No. 48516/76, benzothiazole compound and trihalomethyl-s-triazine compound as disclosed in Japanese Patent Application (OPI) No. 74887/79, acridine and phenazine as disclosed in U.S. Pat. No. 3,751,259.

Additionally, it is preferred to add a thermopolymerization preventing agent such as hydroquinone, p-methoxyphenol, di-tert-butyl-p-cresol, pyrogallol, tert-butylcatechol, benzoquinone, 4,4'-thiobis(3-methyl-6-t-butylphenol), 2,2'-methylenebis(4-methyl-6-t-butylphenol) or 2-mercaptobenzimidazole. And, if necessary, a dye or a pigment can be added to color a light-sensitive layer or a pH indicator as a printout agent can be added.

The light-sensitive layer is exposed with an ultraviolet ray and the unexposed areas where a toner is present on a photoconductive layer are selectively dissolved out and removed by a developing solution. The composition of the developing solution varies depending upon the diazo compound and the binder used. Generally, a watting agent is added such as a sodium salt of lauryl alcohol sulfate (trade name, "Monogen Y-100", manufactured by Daiichi Kogyo Seiyaku Co., Ltd.), sodium salt of alkyllauryl sulfate, sodium salt of octyl sulfate and ammonium salt of lauryl sulfate, sodium xylene sulfonate or monosodium salt of N,N-dihydroxyethylene glycine, and an aqueous alkali solution containing an inorganic alkali agent and an organic amine compound. A water-miscible organic solvent, e.g., alcohols such as ethylene glycol monobutyl ether or benzyl alcohol; carboxylic acid esters such as ethyl acetate and butyl acetate; ketones such as methyl isobutyl ketone; and alkyl substituted aromatic hydrocarbon such as xylene are preferably added in small amounts.

In this invention, by incorporating the conductive agent into not only the positive working light-sensitive layer but also the negative working light-sensitive layer, fog in the development of the photoconductive layer and the printing stain caused therefrom can be prevented.

This invention is further explained with the following examples. However, the invention is not limited to these examples. In the examples, "part" means "part by weight".

EXAMPLE 1

An aluminum plate having a thickness of 0.24 mm was subjected to sand grain treatment and anodically oxidized in a sulfuric acid bath to prepare about 2.7 $g/m^2$ of an oxidized layer. The layer was sufficiently washed, dried and coated with a light-sensitive solution prepared by the following compositions by a whirler and was dried to obtain a light-sensitive layer in a dry thickness of 2.3 $g/m^2$.

| Compositions of the Light-Sensitive Solution | |
|---|---|
| | parts |
| Ester compound of naphthoquinone-(1,2)-diazide-(2)-5-sulfonic acid and pyrogallol acetone resin | 0.85 |
| Cresol novolak resin | 0.05 |
| Methyltetrahydrophthalic anhydride | 0.20 |
| p-t-Butylphenol resin | 2.10 |
| Methyl cellosolve acetate | 20 |
| Methyl ethyl ketone | 10 |

Further, the following light-sensitive solution was dispersed by an ultrasonic dispersing device for 5 minutes and was coated by a wire bar and dried at 70° C. for 1 minute to provide a photosemiconductive layer.

| Compositions of the Light-Sensitive Solution | |
|---|---|
| | parts |
| Novolak type phenol resin 33 wt % in isopropyl alcohol | 12 |
| (ethyl acrylate$_{62}$-methyl methacrylate$_{25}$-methyl acrylic acid$_{13}$) 25 wt % in ethyl alcohol | 4 |
| Phthalocyanine pigment (Sumika Print GN-0; Sumitomo Kagaku) | 1 |
| Toluene | 25 |

The solid content in the photosemiconductive layer was 2.6 g/m$^2$. This light-sensitive plate was given a positive corona charge by a corona charging device set with +6,000 V, exposed for 2 seconds with a tungsten lamp having 60 lux through a positive transparency. Then the plate was developed for 20 seconds in a vat full of a liquid developing solution (MRP-610, manufactured by Ricoh Co., Ltd.) having a negatively charged toner where the stainless electrode was set facing the light-sensitive layer, the electrode being charged positively and the aluminum side of the light-sensitive plate being charged negatively, as shown in FIG. 1. Then, the plate was exposed over its entire surface for 75 seconds by an A3 printer (Exposure Device for Pre-Sensitized plate) manufactured by Fuji Photo Film Co., Ltd. and developed for 1 minute in a developing solution DP-3 solution for presensitized plate manufactured by Fuji Photo Film Co., Ltd. which was diluted by water by 1/7 to obtain a lithographic printing plate. Development with a toner was conducted applying a voltage so that the charge on the surface of the light-sensitive material is removed. The relationship between the bias voltage and the printing stain at the non-imaged areas and the quality of the printed image is shown in Table 1.

Printing stain was not present and printed copies with sufficient ink attached thereto were obtained at 20 to 250 bias volts.

TABLE 1

| Bias Voltage (volt) | Stains at Non-Imaged Areas | Quality of Printed Image |
| --- | --- | --- |
| 0 | x | o |
| 10 | x~Δ | o |
| 20 | o | o |
| 50 | o | o |
| 150 | o | o |
| 250 | o | o |
| 280 | o | x |
| 350 | o | xx |

Stains
o: no stain
Δ: slight stain
x: much stain
Quality
o: excellent
x: poor
xx: very poor

EXAMPLE 2

The same procedure as in Example 1 was repeated except for using the aluminum support having 1.2 g/m$^2$ of the oxidized layer and the following compositions to provide a photosemiconductive layer having 2.0 g/m$^2$ of the solid content.

| Compositions of the Light Sensitive Solution | |
| --- | --- |
| | parts |
| $+$(Ethyl acrylate$_{62}$-methyl methacrylate$_{25}$-methyl acrylic acid$_{13}$)$+$ 25% in ethyl alcohol | 12 |
| Microlith 4G-T (Ciba Geigy) | 1.5 |
| Toluene | 25 |

This light-sensitive plate was given a negative corona charge by a corona charging device set with −6,000 V, exposed for 3 seconds with a tungsten lamp having 60 lux through a positive transparency. Then, the plate was developed for 15 seconds in a tray full of a liquid developing solution (PM313, a developing solution used for plate makers manufactured by Iwasaki Tsushinki K.K.) having a positively charged toner where the stainless electrode was set facing the light-sensitive layer, the counter electrode being charged negatively and the aluminum side of the light-sensitive plate being charged positively. Then, the same procedure as in Example 1 was repeated to obtain a lithographic printing plate.

Printing stain was not present and printed copies with sufficient ink attached thereto were obtained at a bias voltage of 20 to 250 V.

While the invention has been described in detail and with reference to specific embodiments thereof, it will be apparent to one skilled in the art that various changes and modifications can be made therein without departing from the spirit and scope thereof.

What is claimed is:

1. In a method for preparing a lithographic printing plate using a light-sensitive material comprising an aluminum or aluminum alloy support having a hydrophilic surface provided thereon, in order, a light-sensitive layer and a photoconductive insulating layer, said method comprising the steps of:

electrophotographically forming an electrostatic latent image on the photoconductive insulating layer;

developing the electrostatic latent image with developer particles which have a charge opposite to the charge of the electrostatic latent image and which are opaque to the light to which the light-sensitive layer is sensitive in the presence of an electrode facing the photoconductive insulating layer while applying bias voltage between the electrode and the light-sensitive material so that residual charge on the non-latent areas appears zero and the developer particles are attracted to the latent image;

exposing the light-sensitive layer through the developed image; and separating the exposed and unexposed areas of the light-sensitive layer together with the photoconductive insulating layer.

2. A method as claimed in claim 1, wherein an intermediate layer is provided between the photoconductive insulating layer and the light-sensitive layer.

3. A method as claimed in claim 1, wherein the light-sensitive layer and the photoconductive insulating layer are combined together on the hydrophilic surface.

4. A method as claimed in claim 1, wherein the electroconductive support is aluminum having a hydrophilic surface which is a layer of aluminum oxide present in an amount of 0.2 to 2.8 g/m$^2$.

5. A method as claimed in claim 1, wherein the light-sensitive layer contains an electroconductive agent.

6. A method as claimed in claim 1, wherein the separating of the exposed and unexposed areas is carried out by removing the exposed areas.

7. A method as claimed in claim 1, wherein the separating of the exposed and unexposed areas is carried out by removing the unexposed areas.

8. A method as claimed in claim 1, wherein the bias voltage between the electrode and light-sensitive material is within the range of 20 to 250 V.

9. A method as claimed in claim 1, wherein the photoconductive insulating layer has a thickness within the range of 0.5 to 5μ.

10. A method as claimed in claim 9, wherein the photoconductive insulating layer has a thickness within the range of 1 to 2μ.

11. A method as claimed in claim 2, wherein the intermediate layer has a thickness within the range of 0.1 to 5μ.

12. A method as claimed in claim 11, wherein the intermediate layer has a thickness within the range of 0.2 to 0.5μ.

13. In a method for preparing a lithographic printing plate using a light-sensitive material comprising an aluminum or aluminum alloy support having a hydrophilic surface, and provided thereon a light-sensitive layer and a photoconductive insulating layer which are combined together on the hydrophilic surface, said method comprising the steps of:

electrophotographically forming an electrostatic latent image on the photoconductive insulating layer;

developing the electrostatic latent image with developer particles which have a charge opposite to the charge of the electrostatic latent image and which are opaque to the light to which the light-sensitive layer is sensitive in the presence of an electrode facing the photoconductive insulating layer while applying bias voltage between the electrode and the light-sensitive material so that residual charge on the non-image areas appears zero and the developer particles are attracted to the latent image;

exposing the light-sensitive layer through the developed image; and separating the exposed and unexposed areas of the light-sensitive layer together with the photoconductive insulating layer.

14. A method as claimed in claim 13, wherein the electroconductive support is aluminum having a hydrophilic surface which is a layer of aluminum oxide present in an amount of 0.2 to 2.8 g/m$^2$.

15. A method as claimed in claim 13, wherein the separating of the exposed and unexposed areas is carried out by removing the exposed areas.

16. A method as claimed in claim 13, wherein the separating of the exposed and unexposed areas is carried out by removing the unexposed areas.

17. A method as claimed in claim 13, wherein the bias voltage between the electrode and light-sensitive material is within the range of 20 to 250 V.

* * * * *